United States Patent
Sourani et al.

(10) Patent No.: US 9,148,075 B2
(45) Date of Patent: Sep. 29, 2015

(54) MEMS DEVICE AND METHODS FOR MANUFACTURING AND USING SAME

(71) Applicant: STMicroelectronics International N.V., Amsterdam (NL)

(72) Inventors: Sason Sourani, Hod Hasharon (IL); Moshe Medina, Haifa (IL)

(73) Assignee: STMicroelectronics International N.V., Amsterdam (NL)

( * ) Notice: Subject to any disclaimer, the term of this patent is extended or adjusted under 35 U.S.C. 154(b) by 0 days.

(21) Appl. No.: 14/479,615

(22) Filed: Sep. 8, 2014

(65) Prior Publication Data
US 2015/0002916 A1    Jan. 1, 2015

Related U.S. Application Data

(62) Division of application No. 13/365,087, filed on Feb. 2, 2012, now Pat. No. 8,861,062.

(30) Foreign Application Priority Data

Feb. 13, 2011 (IL) .......................................... 211211

(51) Int. Cl.
*G02B 26/08* (2006.01)
*H02N 1/00* (2006.01)
*B81B 7/00* (2006.01)
*G02B 7/182* (2006.01)
*B81B 3/00* (2006.01)

(52) U.S. Cl.
CPC .............. *H02N 1/006* (2013.01); *B81B 3/0043* (2013.01); *B81B 7/00* (2013.01); *B81B 7/008* (2013.01); *G02B 7/1821* (2013.01); *G02B 26/0841* (2013.01); *H02N 1/008* (2013.01); *B81B 2201/033* (2013.01); *B81B 2201/034* (2013.01); *B81B 2201/042* (2013.01); *B81B 2203/0109* (2013.01); *B81B 2203/0181* (2013.01); *B81B 2203/058* (2013.01)

(58) Field of Classification Search
CPC ........... G02B 26/0841; G02B 26/0833; H02N 1/008; B81B 2201/033
USPC ..................... 359/199.2, 200.6, 224.1–224.2; 310/309
See application file for complete search history.

(56) References Cited

U.S. PATENT DOCUMENTS 7,079,299 B1    7/2006  Conant et al.

(Continued)

OTHER PUBLICATIONS

Conant et al: "A Flat High-Frequency Scanning Micromirror," Berkeley Sensor & Actuator Center, Berkeley, CA, 2000.

(Continued)

*Primary Examiner* — James Phan
(74) *Attorney, Agent, or Firm* — Gardere Wynne Sewell LLP

(57) ABSTRACT

A Micro Electro Mechanical Systems (MEMS) device includes a rotor having first rotor teeth and second rotor teeth formed in at least two layers of silicon-on-insulator (SOI) substrate. Each rotor tooth belonging to the first rotor teeth is formed in a first layer and each rotor tooth belonging of the second rotor teeth is formed in a second layer. A stator includes first stator teeth and second stator teeth formed in at least two layers of SOI substrate. Each stator tooth belonging to the first stator teeth is formed in a first layer and each stator tooth belonging to the second stator teeth is formed in a second layer.

12 Claims, 4 Drawing Sheets

(56) References Cited

U.S. PATENT DOCUMENTS

| | | |
|---|---|---|
| 7,089,666 B2 | 8/2006 | Kim et al. |
| 7,538,927 B1 | 5/2009 | Fu |
| 7,573,022 B2 | 8/2009 | Choo et al. |
| 7,808,150 B2 | 10/2010 | Yoda et al. |
| 7,817,331 B2 | 10/2010 | Moidu |
| 2003/0073261 A1 | 4/2003 | Olav et al. |
| 2006/0082250 A1* | 4/2006 | Ko et al. .................. 310/309 |
| 2008/0239446 A1 | 10/2008 | Jung et al. |

OTHER PUBLICATIONS

Hah et al: "Theory and Experiments of Angular Vertical Comb-Drive Actuators for Scanning Micromirrors," J. of Selected Topics in Quantum Electronics, vol. 10, No. 3, May/Jun. 2004, p. 505.

Yeh et al: "Integrated Polysilicon and DRIE Bulk Silicon Micromachining for an Electrostatic Torsional Actuator," J. of Microelectromechanical Systems, vol. 8, No. 4, Dec. 1999, p. 456.

* cited by examiner

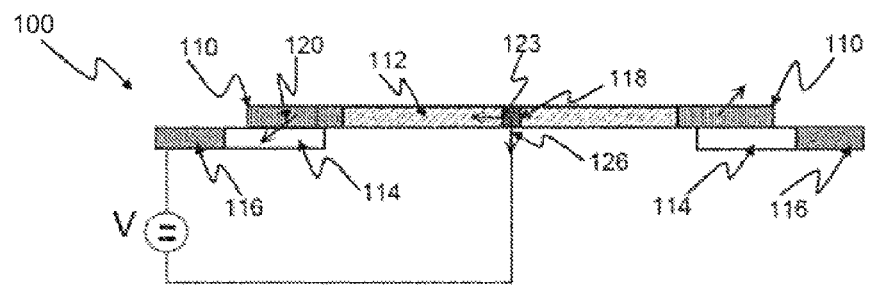
FIG. 1A – PRIOR ART
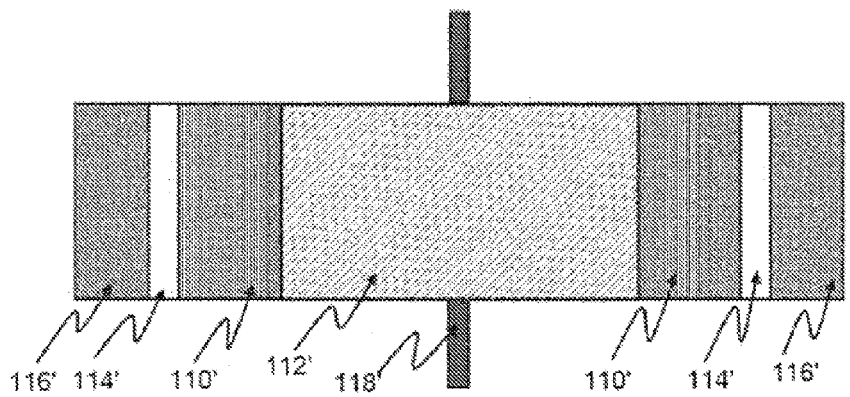
FIG. 1B – PRIOR ART
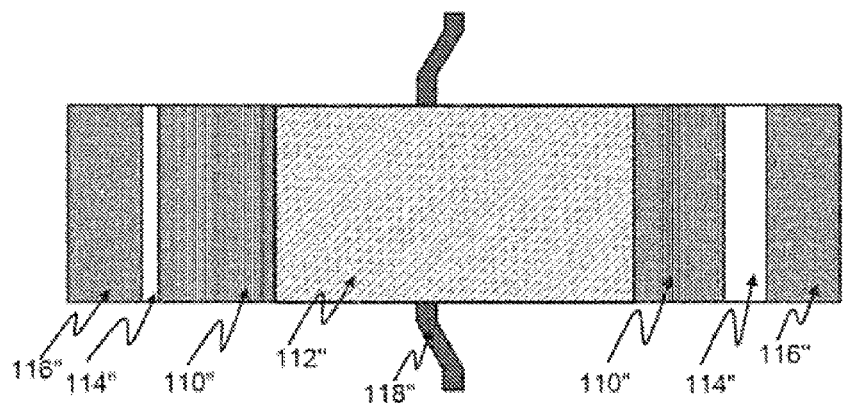
FIG. 1C – PRIOR ART

MEMS DEVICE AND METHODS FOR MANUFACTURING AND USING SAME

CROSS-REFERENCE TO RELATED APPLICATION

This application is a divisional of U.S. application for patent Ser. No. 13/365,087 filed Feb. 2, 2012, now U.S. Pat. No. 8,861,062, which claims priority from Israeli Application for Patent No. 211211 filed Feb. 13, 2011, the disclosures of which are incorporated by reference.

TECHNICAL FIELD

The disclosure relates to optical systems for scanning or deflecting light beams, and in particularly to MEMS/MOEMS devices which comprise movable reflective elements, such as oscillating mirrors.

BACKGROUND

Certain applications including laser projection systems, ray steering applications, optical multiplexers and the like, make use of a narrow collimated laser beam that usually scan across a flat surface along a straight line path. A typical optical scanning system adapted for such purpose employs a tilting flat mirror which deflects the beam. The tilting micro-mirror serves as a central element in many Micro Electro Mechanical Systems ("MEMS") devices and/or Micro Opto Electro Mechanical Systems ("MOEMS") devices. For the convenience of the reader, the term "MEMS" as will be referred to hereinafter throughout the specification and claims should be understood to encompass the terms "MEMS" and/or "MOEMS".

Many of these MEMS devices comprise two types of electro-statically mirrors:

In-plane mirrors—Also known as "Resonance mirrors" are MEMS electrostatic mirrors, usually driven at their respective resonance frequency. The stator and the rotor of these mirrors are composed at the same layer and the mirrors' driving pulses are usually of a rectangular type; and Staggered mirrors—Also known as "Vertical Mirrors" or "Analog Mirrors" or "DC Mirrors", are MEMS electrostatic mirrors, which are typically comprised of two different layers, one that comprises the stator while the other comprises the rotor. In some cases, where the stator or the rotor is tilted permanently after manufacturing, only one layer may be used for the stator and the rotor. The staggered mirrors may operate at their resonance frequency or at lower frequencies down to and including DC voltage, and may tilt to any specified angle within a pre-defined range and for any period of time.

Unfortunately the use of the staggered mirrors is still limited due to several difficulties, among which are:

The manufacturing process is more complex than the in-plain mirrors, and requires a high level of precision; and movement is very weak, so the range of the tilt angle is somewhat limited The electrostatic force which is responsible for the mirror ited.

In order to increase the staggered mirror tilt angle it is required to decrease the spring torsion constant K which in turn would cause undesirable side effects. Although it is highly recommended that the spring constant K will be very low, it turns out to be a rather complicated task. The following parameters affect spring torsion constant K:

a. The material characteristics—The material in most of the staggered mirrors is pre-defined (usually silicon) and cannot be changed.

b. The spring length—Increasing spring length reduces K, however, that involves increasing silicon area and consequently the overall cost.

c. The spring thickness—Although spring thickness could be different from the comb thickness, it is desirable that the spring thickness is the same as the comb thickness and the layer thickness. This way, fewer processes are required and thickness is accurately known. Unfortunately, in order to facilitate large deflections, the required thickness would be relatively large.

d. The spring width—this is actually the only parameter that practically may be changed (free parameter). Reducing spring width would reduce spring torsion constant K, but also would reduce other characteristic constants like its resistance to lateral forces acting on the mirror, and consequently, lateral movements (and also vertical movements) might seriously affect the performance.

Jer-Liang Andrew Yeh, Hongrui Jiang and Norman C. Tien, in their publication "Integrated Polysilicon and DRIE Bulk Silicon Micromachining for an Electrostatic Torsional Actuator", J. of Microelectromechanical Systems, Vol. 8, No. 4, December 1999 (incorporated by reference), describe a process for fabricating comb teeth for the moving part ("rotor") and the non-moving part ("stator"). The rotor teeth lie at different height from the stator teeth. However in this publication, all rotor teeth lie at the same plane while all stator teeth lie at a different plane. Using different planes for the rotor and stator creates torsion forces that tilt the rotor plane.

Dooyoung Hah, Pamela R. Patterson, Hung D. Nguyen, Hiroshi Toshiyoshi and Ming C. Wu describe in their publication "Theory and Experiments of Angular Vertical Comb-Drive Actuators for Scanning Micromirrors", (IEEE J. of Selected Topics in Quantum Electronics, Vol. 10, No. 3, May/June 2004 p.505 (incorporated by reference)) two types of actuators "AVC"—angular vertical comb drive and "SVC" staggered vertical comb drive. In both cases all rotor teeth lie at the same plane, either parallel to the wafer (SVC) or tilted relative to the wafer (AVC), while all stator teeth lie in a different plane. Using different planes (or angles) for the rotor and stator creates torsion forces that tilt the rotor plane.

Similar structures having two distinct planes, one for the rotor and one for the stator are disclosed in U.S. Pat. No. 7,079,299 (incorporated by reference) and in "A FLAT HIGH-FREQUENCY SCANNING MICROMIRROR" by Robert A. Conant, Jocelyn T. Nee, Kam Y. Lau, and Richard S. Muller from Berkeley Sensor & Actuator Center, University of California, Berkeley, Berkeley, Calif. 94720-1774(incorporated by reference). As mentioned above, one of the major drawbacks with these structures concerns the use of different planes for the rotor and stator, which in turn leads to the development of undesired vertical and transversal forces in addition to torsion forces that tilt the rotor plane.

U.S. Pat. No. 7,089,666 (incorporated by reference) provides tilting mechanism for the rotor by heating springs to plasticity and then, cooling them down to their new quiescent position.

U.S. Pat. No. 7,808,150 (incorporated by reference) discloses tilting mechanism to the stator comb teeth, thus achieving similar effects.

U.S. Pat. No. 7,817,331 and US published application 2008/0316577 (both incorporated by reference) propose to tilt either the moving comb, or the stationary comb.

U.S. Pat. No. 7,538,927 (incorporated by reference) describes a method for fabricating MEMS mirror with two different layers and possibly two different etching techniques to optimize speed. Each layer teeth belongs either to the stationary comb (stator), or to the rotational comb.

U.S. Pat. No. 7,573,022 (incorporated by reference) describes a method for fabricating two vertically offset inter-digitated-comb actuato—a fixed comb and a moving comb. Each comb resides at a different layer.

US published application 2003/073261 (incorporated by reference) describes a stationary comb drive and a movable comb drive. Each of the comb drives resides at a different vertical height.

Unfortunately, none of the above publications provides an efficient way to use vertical MEMS mirrors, in a way that would sufficiently overcome the additional electrostatic forces that cause lateral and vertical forces, which in return affect the performance of the staggered mirror.

SUMMARY

In an embodiment, a new structure for staggered mirrors is provided that is able to eliminate, or decrease substantially, undesirable side effects caused by the decrease of the spring constant and thereby to provide an improved staggered MEMS mirror.

An embodiment provides a structure for staggered mirrors comprising a reduced spring width and decreased spring torsion constant, to allow increasing the staggered mirror tilt angle.

An embodiment provides a structure for staggered mirrors that minimizes lateral and vertical electrostatic forces that might adversely affect the performance of the staggered mirror.

According to a first embodiment, there is provided a MEMS device comprising: a rotor, comprising a first plurality of rotor teeth and a second plurality of rotor teeth, formed in at least two layers of silicon-on-insulator (SOI) substrate, wherein each rotor tooth belonging to the first plurality of rotor teeth is formed in a first layer out of the rotor's at least two layers of SOI substrate, and each rotor tooth of the second plurality of rotor teeth is formed in a second layer out of the rotor's at least two layers of SOI substrate; and a stator comprising a first plurality of stator teeth and a second plurality of stator teeth, formed in at least two layers of SOI substrate, wherein each stator tooth belonging to the first plurality of stator teeth is formed in a first layer out of the stator's at least two layers of SOI substrate, and each stator tooth of the second plurality of stator teeth is formed in a second layer out of the stator's at least two layers of SOI substrate.

Preferably, the rotor further comprises a rotatable reflective surface.

Although the rotor and stator of the MEMS device provided herein are described as being formed in at least two layers of silicon-on-insulator (SOI) substrate, still, the term "SOI" should be understood to encompass also other types of substrates, e.g. where one of the layers is made of Pyrex, and the like.

According to another embodiment, in a rest position, the upper surface of each rotor tooth belonging to the first plurality of rotor teeth is located essentially at the same plane as the upper surface of a rotatable and reflective surface, and wherein the upper surface of each rotor tooth belonging to the second plurality of rotor teeth is located at a plane lower than the upper surface of the rotatable reflective surface.

By still another embodiment, the stator is comprised of two sectors each comprising one or more stator teeth and located essentially in parallel to the other of the two sectors, and wherein one of the two sectors is formed in the first layer of the stator's at least two layers and the second sector is formed in the second layer of the stator's at least two layers.

According to yet another embodiment, the MEMS device comprises two stators, wherein one of the two stators is operative to rotate a rotatable reflective surface clockwise while the other of the two stators is operative to rotate the rotatable reflective surface counter clockwise, wherein each of the two stators comprises a first plurality of stator teeth and a second plurality of stator teeth, and wherein the first plurality of stator teeth are formed in at least one layer of SOI substrate different from a layer of SOI substrate in which the second plurality of stator teeth are formed.

In accordance with still another embodiment, the MEMS device comprises two stators, wherein each of the two stators comprises two sectors, and wherein each of the two sectors is positioned essentially in parallel to the other sector of its respective stator and a rotatable reflective surface is located therebetween. Optionally, a first sector of the first stator is formed in a first layer out of the at least two layers of SOI substrate and a first sector of a second stator is formed in a second layer out of at the least two layers of SOI substrate, and the stators' teeth belonging to the two first sectors are interleaved, whereas the second sector of the first stator is formed in the second layer out of at least two layers of SOI substrate and the second sector of the second stator is formed in the first layer out of at least two layers of SOI substrate, and the stators' teeth belonging to these two second sectors are interleaved.

According to another embodiment, the first plurality of rotor teeth is located above the first plurality of stator teeth, and the second plurality of rotor teeth is located below the second plurality of the stator teeth, and upon applying voltage to the stator, the first plurality of rotor teeth which are located opposite to the first plurality of stator teeth is adapted to move downwardly whereas the second plurality of rotor teeth which are located opposite to the second plurality of stator teeth is adapted to move upwardly.

According to another aspect there is provided a method for minimizing lateral and/or vertical electrostatic forces to which a rotatable reflective surface of a MEMS device is subjected to, the method comprising: providing a rotor which comprises a first plurality of rotor teeth, each of which is formed in a first layer of an SOI substrate and a second plurality of rotor teeth, each of which is formed in a second layer of an SOI substrate; providing at least one stator which comprises a first plurality of stator teeth, each of which is formed in a first layer of an SOI substrate and a second plurality of stator teeth, each of which is formed in a second layer of an SOI substrate; applying voltage to at least one of the at least one stator provided, thereby causing all of the first plurality of rotor teeth located opposite to the first plurality of stator teeth of the at least one stator to move downwardly and all of the second plurality of rotor teeth located opposite to the second plurality of stator teeth of the at least one stator to move upwardly.

According to another embodiment, the first plurality of rotor teeth is located above the first plurality of teeth of the at least one stator, and the second plurality of rotor teeth is located below the second plurality of teeth of the at least one stator.

By yet another embodiment, at a rest position, the upper surface of each rotor tooth belonging to the first plurality of rotor teeth is located essentially at the same plane as the upper surface of the rotatable reflective surface, and the upper surface of each rotor tooth belonging to the second plurality of rotor teeth is located at a plane lower than the upper surface of the rotatable reflective surface.

In accordance with still another embodiment by which the MEMS device comprises at least two stators, the step of applying voltage to one of the at least two stators results in rotating a rotatable reflective surface clockwise whereas applying voltage to another stator of the at least two stators results in rotating the rotatable reflective surface counter clockwise.

According to still another aspect, there is provided a method for forming MEMS device, the method comprising: etching a rotor, comprising a first plurality of rotor teeth and a second plurality of rotor teeth, formed in at least two layers of silicon-on-insulator (SOI) substrate, wherein each rotor tooth belonging to the first plurality of rotor teeth is formed in a first layer out of the rotor's at least two layers of SOI substrate, and each rotor tooth of the second plurality of rotor teeth is formed in a second layer out of the rotor's at least two layers of SOI substrate; etching a stator comprising a first plurality of stator teeth and a second plurality of stator teeth, formed in at least two layers of SOI substrate, wherein each stator tooth belonging to the first plurality of stator teeth is formed in a first layer out of the stator's at least two layers of SOI substrate, and each stator tooth of the second plurality of stator teeth is formed in a second layer out of the stator's at least two layers of SOI substrate; and wherein the first plurality of rotor teeth are etched so that they are positioned above the first plurality of stator teeth, and the second plurality of rotor teeth are etched so that they are positioned below the second plurality of the stator teeth.

BRIEF DESCRIPTION OF THE DRAWINGS

Other advantages and features of the invention will become apparent upon studying the detailed description of embodiments and of their implementation, taken by way of non-limiting example and illustrated by the appended drawings in which:

FIGS. 1A-1C present an example of typical staggered mirror known in the art wherein:

FIG. 1A provides a side view of the typical staggered mirror;

FIG. 1B provides an up view of the typical staggered mirror in Rest; and

FIG. 1C provides an up view of the typical staggered mirror which due to the lateral force moved laterally towards the stationary left comb;

FIGS. 2A-2B present an example of a staggered mirror configuration which rotates the mirror counter clockwise wherein:

FIG. 2A provides a side view of the active section of the staggered mirror that rotates the mirror counter clockwise; and FIG. 2B provides an up view of the active section of the staggered mirror that rotates the mirror counter clockwise;

FIGS. 3A-3B present an example of staggered mirror configuration which rotates the mirror clockwise, wherein:

FIG. 3A provides a side view of the active section of the staggered mirror that rotates the mirror clockwise; and FIG. 3B provides an up view of the active section of the staggered mirror that rotates the mirror clockwise;

DETAILED DESCRIPTION OF THE DRAWINGS

Figure 2A:
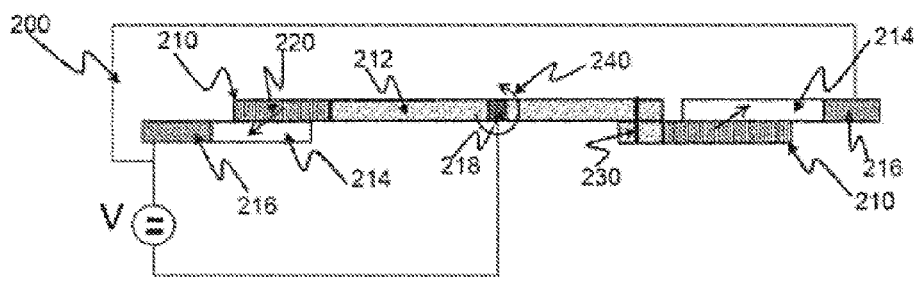

A better understanding of the present invention may be obtained when the following non-limiting detailed examples are considered in conjunction with the accompanying drawings.

FIGS. 1A-1C present an example of a typical staggered mirror known in the art. FIG. 1A illustrates a schematic side view of a typical prior art staggered mirror. The device (100) illustrated in FIGS. 1A-1C comprises two types of "combs" (also known as "fingers" or "teeth"). A rotary comb (110) is connected to the tilting mirror (112) and a stationary comb (114) is connected to a MEMS structure (116), where both types of fingers reside at the same plane, and a torsional spring (118) enables the movable MEMS part to move. When voltage is applied to the device as illustrated in FIGS. 1A-1C it causes the rotor to move counter-clockwise (the left side of the rotor moves towards the left stationary comb), where this movement is exemplified in FIG. 1A by arrow 120. The applied voltage causes the spring (118) to be subjected to lateral electrostatic force (123) and vertical electrostatic force (126).

FIG. 1B provides a top view of the typical staggered mirror shown in its resting position (when no voltage is applied thereon). Rotary combs 110' are connected to the tilting mirror (112'), whereas stationary combs 114' are connected to MEMS structure (116'). 118' is the torsional spring. As may be seen in this FIG. 1B, the torsional spring (118') is straight because the staggered mirror is being in its resting position.

FIG. 1C provides a top view of the typical staggered mirror after the rotor had moved counter-clockwise. Again, rotary combs 110" are shown connected to the tilting mirror (112"), stationary combs 114" are connected to the MEMS structure (116"), and the torsional spring 118" is skewed because the rotor had moved counter-clockwise.

In order to reduce the lateral and vertical electrostatic forces while leaving the rotational moment intact, embodiments herein provide a solution of using a scheme as exemplified in FIGS. 2A-2B and FIGS. 3A-3B.

Figure 2B:
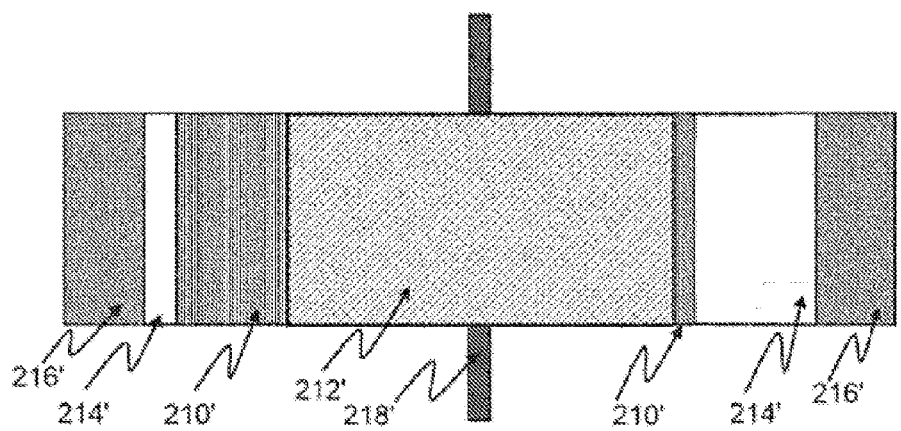

FIGS. 2A-2B present a non-limiting example with an active section of a staggered mirror which rotates the mirror counter clockwise. The configuration (200) presented in FIG. 2A also comprises a rotary comb (210) connected to the tilting mirror (212), a stationary comb (214) which is connected to MEMS structure (216), and a torsional spring (218). Unlike the devices which are known in the art, in this non limiting example each of the stationary comb and the rotary comb is composed of two layers. The mirror rotates counter-clockwise (240) due to voltage applied to the rotary comb and to the left and right sides of the stationary comb. Unlike previous devices (e.g. as the one shown in FIG. 1A), the lateral, as well as the vertical, acting forces have almost a net value of zero, since the force vectors acting to rotate the mirror counter clockwise substantially cancel each other. This outcome therefore is an almost pure rotational moment of rotor. FIG. 2B provides a top view of the active section of the staggered mirror that is operative to rotate the mirror counter clockwise, shown in its resting position. It comprises the rotary comb (210'), the tilting mirror (212'), the stationary comb (214'), the stator (216') and the torsional spring (218'). As may be seen in FIG. 2B, most of the right rotary comb is under the right stationary when the movement of the mirror is counter clockwise, i.e. the left side is moving upwardly (outside the page plane) while the right side is moving downwardly (inside the page plane).

Figure 3A:
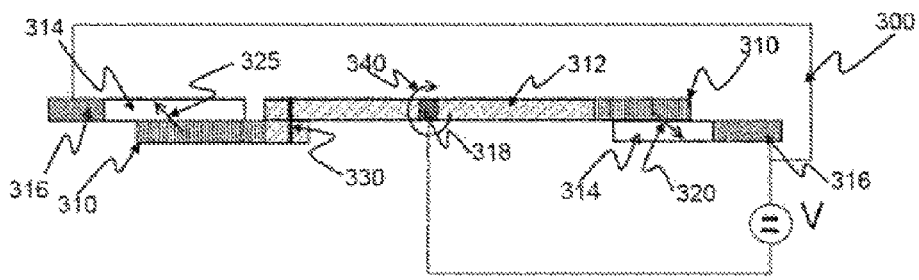
Figure 3B:
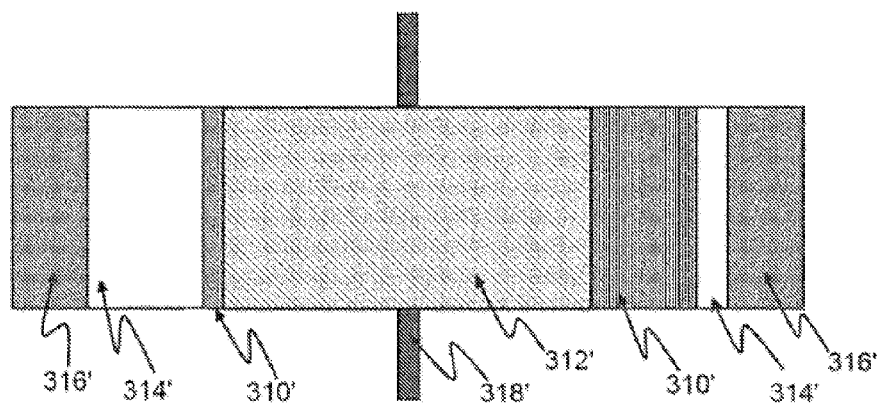

FIGS. 3A-3B present a non-limiting example of an active section of a staggered mirror which rotates the mirror clockwise. The configuration shown in FIG. 3A is similar to the one illustrated in FIG. 2A. It also comprises a rotary comb (310) connected to the tilting mirror (312), a stationary comb (314) connected to MEMS structure (316), and a torsional spring (318). Similarly to the configuration discussed hereinabove with reference to FIG. 2A, the stationary comb and the rotary comb are composed of the two layers. The mirror rotates clockwise (340) due to voltage applied to the rotary comb and to the left and right sides of the stationary comb. The forces' vectors acting to rotate the mirror clockwise (320 and 325) substantially cancel each other, which in return results in an almost pure rotational moment of the rotor. FIG. 3B provides a top view of the active section of a staggered mirror that is operative to rotate the mirror clockwise shown in its resting position. It comprises the rotary comb (310'), the stationary comb (314') and the torsional spring (318'). As may be seen in FIG. 3B most of the left rotary comb is located underneath the left side of the stationary comb, the movement of the mirror is clockwise, i.e. the right side is moving upwardly (outside the page plane) while the left side is moving downwardly (inside the page plane).

Figure 4:
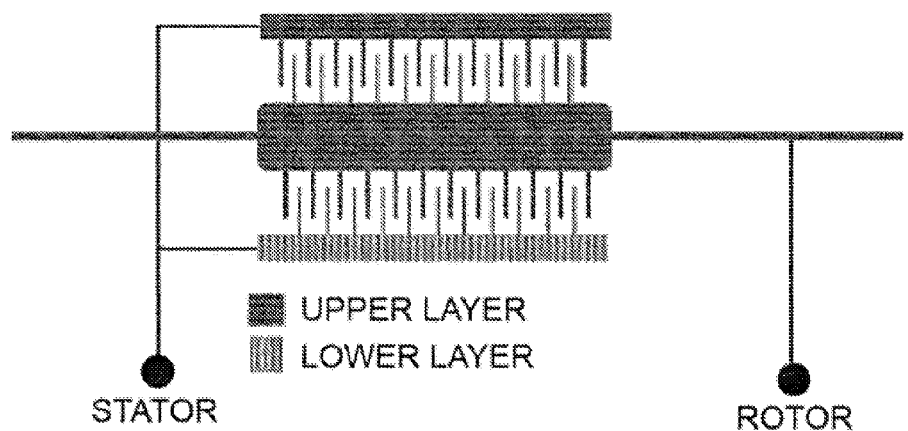
FIG. 4 illustrates a mirror configuration according to an embodiment.
Figure 5:
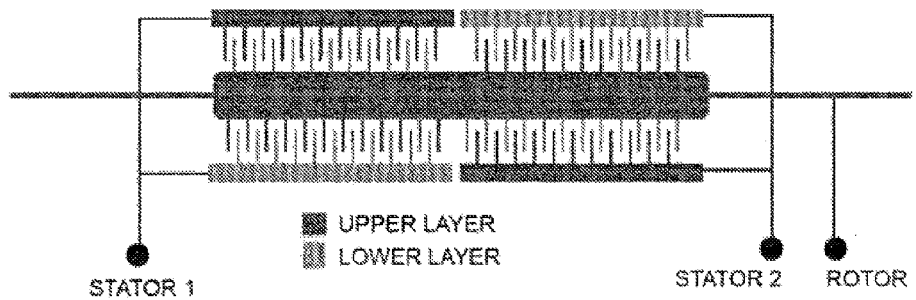
FIG. 5 illustrates a mirror configuration according to an embodiment.
Figure 6:
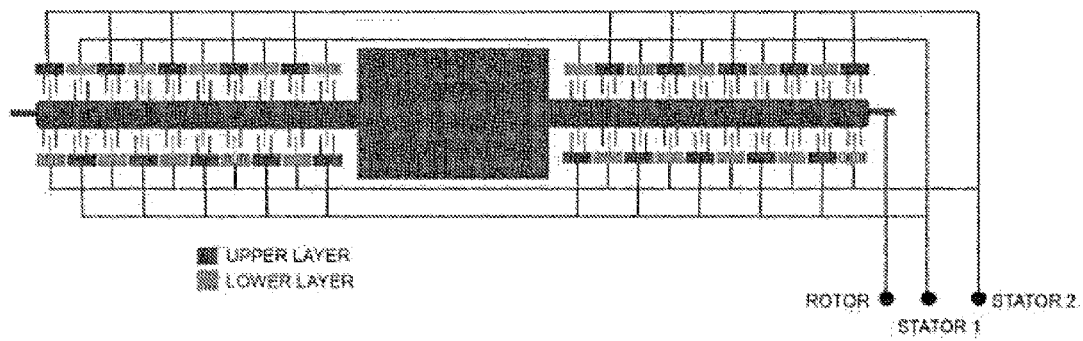
FIG. 6 illustrates a mirror configuration according to an embodiment.
Figure 7:
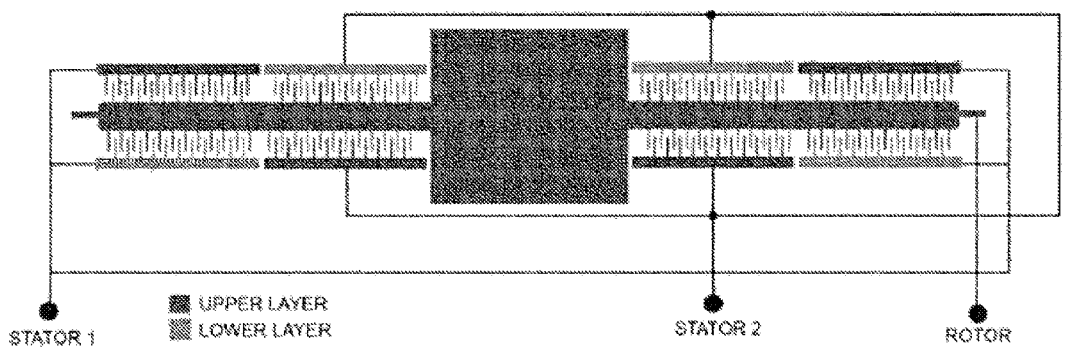
FIG. 7 illustrates a mirror configuration according to an embodiment.

According to one embodiment, the device is adapted to allow the mirror to turn only to one direction, either to move clockwise or counter clockwise. Since all comb teeth (fingers) operate, the rotational moment is increased by a factor of 2 as compared with prior art solutions (FIG. 4). In the alternative embodiment, the device is adapted to allow both movements (clockwise and counter clockwise). Examples of devices embodying both movements are illustrated in FIGS. 5 to 7. As will be appreciated by those skilled in the art, although the ratio between the number of stator elements adapted to turn the mirror clockwise and the number of stator elements adapted to turn the mirror counter clockwise as shown in these examples is 1:1, the embodiments should not be considered as being limited to that ratio, and other devices with different ratios e.g. 1:2 or 2:3 should be considered as being encompassed within the scope of the present invention.

FIG. 4 demonstrates a configuration with only stator, thus the mirror can turn only to one direction. However all comb teeth (fingers) are operative, a fact which leads to an increase in the rotational moment by a factor of 2.

FIG. 5 illustrates a configuration comprising two stators, wherein the rotor comb teeth exit from the mirror and the mirror may rotate in both directions. Applying voltage between stator 1 and the rotor, rotates the mirror towards one direction. Applying voltage between stator 2 and the rotor— rotates the mirror towards the other direction.

FIG. 6 shows yet another configuration comprising two stators, wherein the rotor comb teeth exit from mirror and the mirror may rotate in both directions. By this example, the force distributed evenly over the rotor, alternate teeth are used so that stator 1 and stator 2 are distributed evenly along the rod.

FIG. 7 illustrates yet another two stators configuration of a device that comprises a mirror which may rotate in either direction. In this example the force vectors operate in symmetry but in larger groups when compared with the example illustrated in FIG. 6. Now, although the force is distributed less evenly than the in the preceding example, still, the wiring in this case is simpler and more teeth can be accommodated.

The present invention has been described using non-limiting descriptions of preferred embodiments that are provided by way of example and are not intended to limit the scope of the invention. It should be understood that features described with respect to one embodiment may be used with other embodiments and that not all embodiments of the invention limited to specific features shown in a particular figure. Variations of embodiments described will occur to persons of the art. Furthermore, the terms "comprise," "have" and their conjugates, shall mean, when used in the claims, "comprising but not necessarily limited to." The scope of the invention is limited only by the following claims.

What is claimed is:

1. A method, comprising:
providing a rotor which comprises a first plurality of rotor teeth, each of which is formed in a first layer of an SOI substrate, and a second plurality of rotor teeth, each of which is formed in a second layer of an SOI substrate;
providing at least one stator which comprises a first plurality of stator teeth, each of which is formed in a first layer of an SOI substrate, and a second plurality of stator teeth, each of which is formed in a second layer of an SOI substrate; and
applying voltage to said at least one stator, thereby causing all of the first plurality of rotor teeth located opposite to the second plurality of stator teeth of said at least one stator to move downwardly and all of the second plurality of rotor teeth located opposite to the first plurality of stator teeth of said at least one stator to move upwardly.

2. The method according to claim 1, wherein the first plurality of rotor teeth is located above the second plurality of stator teeth of the at least one stator, and the second plurality of rotor teeth is located below the first plurality of stator teeth of the at least one stator.

3. The method according to claim 1, wherein an upper surface of each rotor tooth belonging to the first plurality of rotor teeth is located at the same plane as the upper surface of the rotor, and wherein upper surface of each rotor tooth belonging to the second plurality of rotor teeth is located at a plane lower than the upper surface of the rotor.

4. The method according to claim 1, wherein providing at least one stator comprises providing at least two stators, and wherein said step of applying voltage comprises applying voltage to one stator to cause rotating of the rotatable reflective surface on the rotor clockwise and applying voltage to another stator to cause rotating of the rotatable reflective surface on the rotor counter clockwise.

5. The method according to claim 1, wherein providing at least one stator comprises providing at least two stators, wherein said rotatable reflective surface on rotor is located between the two stators.

6. A MEMS device, comprising:
a rotor formed of a multilayer structure and including a first plurality of rotor teeth formed in an upper layer of said multilayer structure and extending from a first side of the rotor and including a second plurality of rotor teeth formed in a lower layer of said multilayer structure and extending from a second side of the rotor; and
a stator formed of said multilayer structure and including a first plurality of stator teeth formed in the upper layer of said multilayer structure and extending from a first side of the stator and including a second plurality of rotor teeth formed in the lower layer of said second multilayer structure and extending from a second side of the stator;
wherein the first side of the rotor is adjacent the second side of the stator and wherein the second side of the rotor is adjacent the first side of the stator.

7. The MEMS device of claim 6, wherein the first and second sides of the rotor are on opposite sides of the rotor and the first and second sides of the stator are on opposite sides of the stator.

8. The MEMS device of claim 6, wherein the first and second sides of the rotor are aligned with each other on a same side of the rotor and the first and second sides of the stator are aligned with each other on a same side of the stator.

9. The MEMS device of claim 6, wherein a top surface of the rotor has a mirrored surface.

10. The MEMS device of claim 6, further comprising a circuit configured to apply drive signals to the rotor and stator and including a first signal applied between the rotor and the first plurality of stator teeth to cause rotation of the rotor about an axis of rotation in a first rotational direction, and a second signal applied between the rotor and the second plurality of stator teeth to cause rotation of the rotor about the axis of rotation in a second rotational direction opposite the first rotational direction.

11. The MEMS device of claim 6, wherein said rotor is supported by the stator for rotation about an axis of rotation and wherein the rotor and the first plurality of stator teeth interact to support rotation of the rotor about the axis of rotation in a first rotational direction and wherein the rotor and the second plurality of stator teeth interact to support rotation of the rotor about the axis of rotation in a second rotational direction opposite the first rotational direction.

12. The MEMS device of claim 6, wherein the rotor and stator teeth are interdigitated.

\* \* \* \* \*

UNITED STATES PATENT AND TRADEMARK OFFICE
CERTIFICATE OF CORRECTION

| | | |
|---|---|---|
| PATENT NO. | : 9,148,075 B2 | Page 1 of 1 |
| APPLICATION NO. | : 14/479615 | |
| DATED | : September 29, 2015 | |
| INVENTOR(S) | : Sason Sourani et al. | |

It is certified that error appears in the above-identified patent and that said Letters Patent is hereby corrected as shown below:

In the Specification:

At column 1, line numbers 58 – 61, please replace the following text:

[[movement is very weak, so the range of the tilt angle is somewhat limited

The electrostatic force which is responsible for the mirror ited.]]

with the following text:

-- The electrostatic force which is responsible for the mirror movement is very weak, so the range of the tilt angle is somewhat limited. --.

At column 3, line number 6, please replace [[actuato]] with -- actuator --.

Signed and Sealed this
Twenty-third Day of February, 2016

Michelle K. Lee
*Director of the United States Patent and Trademark Office*